(12) United States Patent
Holman

(10) Patent No.: US 10,728,649 B1
(45) Date of Patent: Jul. 28, 2020

(54) MULTIPATH AUDIO STIMULATION USING AUDIO COMPRESSORS

(71) Applicant: Apple Inc., Cupertino, CA (US)

(72) Inventor: Tomlinson Holman, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 56 days.

(21) Appl. No.: 15/990,033

(22) Filed: May 25, 2018

Related U.S. Application Data

(60) Provisional application No. 62/511,844, filed on May 26, 2017.

(51) Int. Cl.
*H04R 1/10* (2006.01)
*H03G 5/16* (2006.01)
*H04R 3/14* (2006.01)

(52) U.S. Cl.
CPC ........... *H04R 1/1091* (2013.01); *H03G 5/165* (2013.01); *H04R 1/1016* (2013.01); *H04R 1/1041* (2013.01); *H04R 3/14* (2013.01); H04R 2460/13 (2013.01)

(58) Field of Classification Search
CPC .. H04R 1/1091; H04R 1/1016; H04R 1/1041; H04R 3/14; H04R 2460/13; H03G 5/165
USPC ................. 381/74, 151, 380, 374, 106, 104; 704/500, 501, 502, 503, 504
See application file for complete search history.

(56) References Cited

U.S. PATENT DOCUMENTS

| | | | |
|---|---|---|---|
| 9,020,168 B2 | 4/2015 | Karkkainen et al. | |
| 9,866,978 B2 | 1/2018 | Michel et al. | |
| 2010/0290654 A1* | 11/2010 | Wiggins | H04R 25/70 381/314 |
| 2013/0051585 A1* | 2/2013 | Karkkainen | H04R 1/1075 381/151 |
| 2014/0169596 A1* | 6/2014 | Lunner | A61B 5/0476 381/314 |
| 2014/0205106 A1* | 7/2014 | Linn | H04R 3/02 381/71.2 |
| 2014/0348365 A1 | 11/2014 | Edwards | |
| 2015/0010168 A1* | 1/2015 | Cheng | H04R 3/002 381/107 |
| 2017/0318372 A1 | 11/2017 | Gerber et al. | |

* cited by examiner

*Primary Examiner* — Vivian C Chin
*Assistant Examiner* — Con P Tran
(74) *Attorney, Agent, or Firm* — Robert C. Kowert; Kowert, Hood, Munyon, Rankin & Goetzel, P.C.

(57) ABSTRACT

An apparatus for delivering audio signals to a user includes an air-conduction transducer and a bone-conduction transducer. The air-conduction transducer is configured to convert a component of the audio signals to air vibrations detectable by an ear of the user. The bone-conduction transducer is configured to convert another component of the audio signals to vibrations in a cranial bone of the user via direct contact with the user. The apparatus employs one or more filters to separate input audio signals to produce a high-frequency component, a mid-frequency component, and a low-frequency component. The mid- and low-frequency components are processed using compressors to reduce the dynamic range of the components, and then combined to produce a combined component. The combined component is delivered to the user through the bone-conduction transducer, and the high-frequency component is delivered to the user through the air-conduction transducer.

20 Claims, 7 Drawing Sheets

MULTIPATH AUDIO STIMULATION USING AUDIO COMPRESSORS

PRIORITY INFORMATION

This application claims priority to U.S. provisional patent application Ser. No. 62/511,844, titled "Multipath Audio Stimulation Using Audio Compressors," filed May 26, 2017, which is hereby incorporated by reference in its entirety as though fully and completely set forth herein.

BACKGROUND

Technical Field

This disclosure relates generally to audio communication systems that deliver audio signals to a user. More specifically, the disclosure describes audio communication systems that employ different modes of audio signal transduction to provide the audio signals to the user, including an air-conduction transducer and a bone-conduction transducer.

Description of the Related Art

Bone-conduction headphones allow a user to hear sounds through vibration of the bones in the user's cranium. Bone-conduction headphones are different from air-conduction headphones, which convert sound signals to air vibrations that are then detected by the human ear. With bone conduction, sound signals are transmitted directly to the user's body, via direct contact with the user. Different types of bone-conduction headphones can operate by contacting different portions of the user's head and transmitting sound through different portions of the user's cranium. For example, a set of bone-conduction headphones may be designed to vibrate the temporal bones on the sides of the user's face, either in front of or behind the user's ear. Other bone-conduction headphones may be designed to transmit sound through other parts of the cranium, such as the sphenoid bone, the jaw bone, or the nasal bone.

Bone-conduction headphones provide a number of advantages over air conduction headphones. For example, because bone-conduction headphones do not obstruct the air in the user's ear canal, bone-conduction headphones allow the user to continue to hear external sound along with the transmitted sounds. Bone-conduction headphones are also useful for users whose normal auditory pathway is impaired or damaged by bypassing the impaired portions of the auditory anatomy. Bone-conduction headphones are also useful in environments where air conduction is not possible, such as underwater environments.

Despite their usefulness, however, bone-conduction headphones also present a number of drawbacks. First, bone conduction does not work well for high-frequency sounds. The human audible range generally ranges from 20 to 20,000 Hertz. However, the effectiveness of bone conduction decreases significantly at frequencies higher than approximately 4,000 Hz. Moreover, because bone conduction works by direct contact with the head, bone-conduction headphones may cause a tactile sensation on the user's skin. This tactile sensation is especially noticeable when the bone-conduction headphones are operating at a high intensity, and results in to a tickling sensation to the user, which can range up to annoying. These problems generally limit the usability of bone-conduction headphones for ordinary consumers.

SUMMARY OF EMBODIMENTS

An apparatus for delivering audio signals to a user is disclosed herein. That apparatus may receive or generate the audio signals to be delivered to the user. The apparatus may comprise a headphone, a headset, an earpiece, a hearing aid, or the like that includes an air-conduction transducer and a bone-conduction transducer. The air-conduction transducer may be configured to convert a component of the audio signals to air vibrations detectable by an ear of the user. The bone-conduction transducer may be configured to convert another component of the audio signals to vibrations in a cranial bone of the user via direct contact with the user. Thus, the apparatus is capable of delivering the audio signals to the user via both transducers. In some embodiments, the air-conduction transducer may be designed such that it can generate sounds into an ear cavity of the user without substantially blocking the ear cavity from other sounds. Thus, such embodiments retain the benefit of standalone bone-conduction headphones that permits external sound to be received by the user.

In some embodiments, the apparatus may employ one or more filters to separate input audio signals into different frequency ranges. In embodiments, the ranges may include a first frequency range and a second frequency range. The first frequency range, which may be a high-frequency range, may be delivered to the user through the air-conduction transducer. The second frequency range, which may be a low-frequency range, may be delivered to the user through the bone-conduction transducer.

In some embodiments, audio processing techniques may be employed to reduce the dynamic range of the components. For example, compressors may be used to reduce the output intensity of the components relative to the input intensity. The compression may be performed on components of the audio signals that are delivered through the bone-conduction transducer, so as to reduce the tickling sensation to the user at high intensity levels. In some embodiments, the compression may be tuned to balance the psychophysical response in the user produced by the different transducers. Thus, components of the audio signal delivered via the air-conduction transducer and the bone-conduction transducer may be perceived by the user to be at approximately the same degree of loudness.

In some embodiments, the bone-conduction component of the audio signals may be subdivided into smaller frequency components and processed differently. Thus, for example, different subcomponents of the bone-conduction component may be compressed according to different input-output transfer functions. By using multiple frequency subcomponents, the processing of the bone-conduction component of the audio signals may be configured more flexibly. The frequency components may then be recombined and transmitted to the bone-conduction transducer. In some embodiments, parameters of the processing, including the filter ranges and the compression settings, may be configurable by the user via a graphical user interface or user controls on the apparatus. These and other features of the inventive apparatus are described in further detail below, in connection with the Figures.

DETAILED DESCRIPTION

Figure 1A:
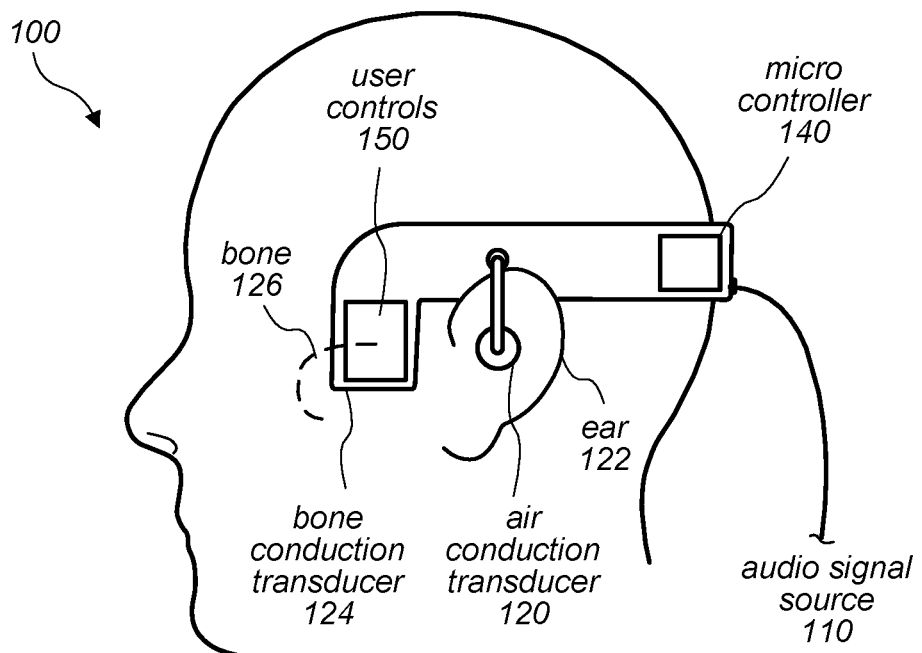
FIGS. 1A and 1B illustrate a headset that includes an air-conduction transducer and a bone-conduction transducer, according to some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . ." Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

Figure 1B:
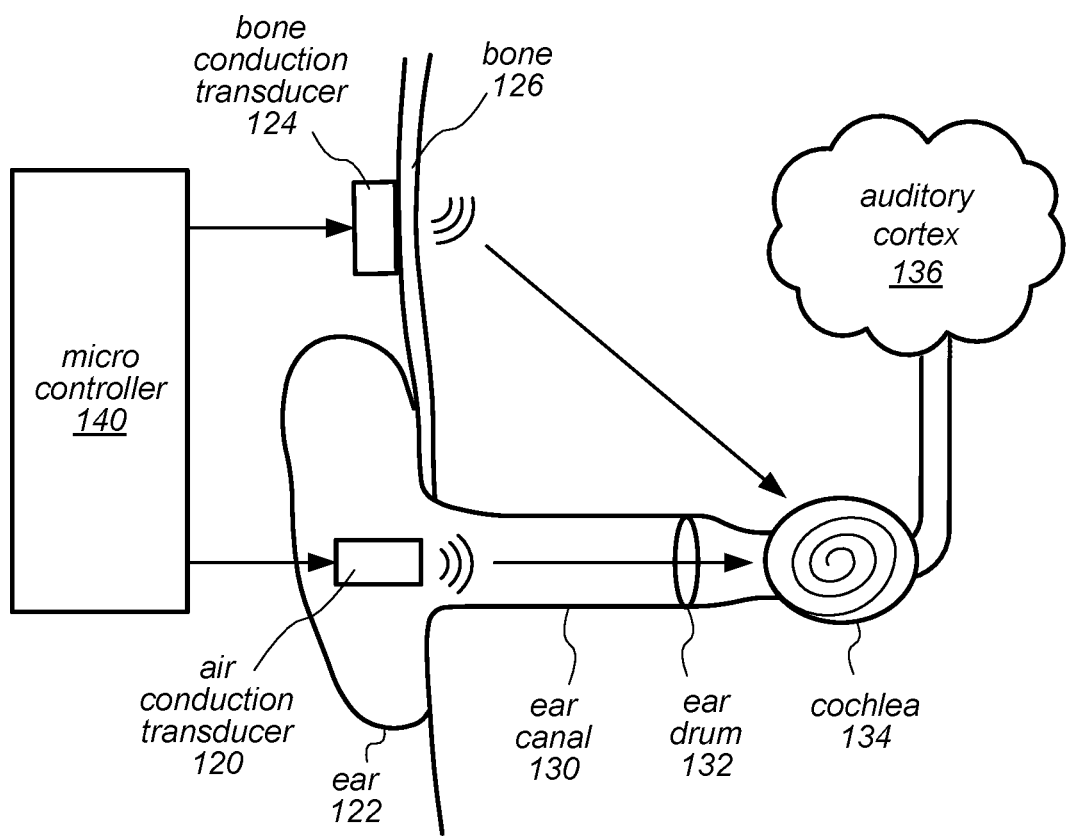

FIGS. 1A and 1B illustrate a headset that includes an air-conduction transducer and a bone-conduction transducer, according to some embodiments. As shown, the apparatus 100 may comprise a headset that is designed to be worn on the head of a user. However, the inventive concepts disclosed herein may be implemented in articles or devices other than a monolithic headset. For example, in some embodiments, the air-conduction transducer and the bone-conduction transducer may be two separate pieces. In some cases, the bone-conduction transducer may comprise a subdermal implant. The headset 100 may include other components not shown in the Figures. For example, in some embodiments, the headset 100 may comprise a computer capable of generating content and/or communicating with other computers via a network interface. As another example, the headset 100 may comprise a peripheral device that is controllable by another computing device proximal to the user, such as the user's smartphone. In some cases, the headset 100 may include a pair of viewing glasses capable of displaying a video to the user or augmenting the visual perceptions of the user. The headset 100 may also include user input controls 130 that allows the user to interact with the headset. For example, the headset may include a microphone that is capable of capturing voice commands spoken by the user. In some cases, the headset 100 may include sensors capable of capturing physiological data from the user, such as the user's heart rate. The headset 100 may include a power source, such as a battery, or an interface to an external power source.

As shown, the headset 100 includes an interface to connect to and receive audio signals from an audio signal source 110. The audio signal source 110 may comprise any type of source or device capable of generating or transmitting audio signal to be delivered to the user. Examples of such audio signal sources may include for example smartphones, tablets, computers, music players such as CD or cassette players, radios, televisions, musical instruments, hearing aids, microphones, speakers, and the like. In some embodiments, the audio signal source 110 may be part of the headset 100. For example, the headset 100 may comprise a wearable computing device such as a pair of augmented reality or virtual reality glasses capable of generating audio. Moreover, although the FIG. 1A depicts the audio signal source to be connected to the headset 100 via a wire, in other embodiments the connection may be wireless. For example, the headset 100 may be connected to the audio signal source 110 to receive audio signals via a type of wireless protocol. Such protocols may include for example Bluetooth, WiFi, a cellular protocol such as CDMA or GSM, or any other type of commercial or proprietary wireless protocol.

The headset 100 includes an air-conduction transducer 120 and a bone-conduction transducer 125. The air-conduction transducer is designed to convert audio signals to vibrations in the air that are detectable by the user's ear 122. Specifically, air vibrations in the ear canal 130 vibrates the ear drum 132, which in turn cause vibrations in the cavity of the user's middle ear, ultimately causing vibrations in the bony chamber of the cochlea 134. The inside of cochlea 134 is line with sensory hair cells that are connected to the user's auditory cortex 136.

The headset 100 may include two air-conduction transducers 120, one for each respective ear 122 of the user. The air-conduction transducer 120 may comprise a loudspeaker that is placed in or in proximity to the user's ear canal 130. The air-conduction transducer 120 may be positioned to direct sound into the user's ear canal 130. In some embodiments, air-conduction transducers 120 may be configured such that they do not substantially block the opening to the ear canal 130, so that the ear can continue to receive external sound from the user's surroundings. For example, the air-conduction transducer 120 may be suspended via an attachment to the headset 100 or an earpiece, which positions the air-conduction transducer 120 in such a way that avoids substantially blocking the user's ear from external sound. In other examples, the air-conduction transducer 120 may include an opening that allows external sound to reach the user's ear canal 130. The positioning of the air-conduction transducer 120 or the opening thereon may be configurable by the user to accommodate the user's particular anatomy or preferences. In some cases, the headset 100 may utilize to hearing aid technology to capture external sound and amplify these sounds to the user via the air-conduction transducers 120. The amplification of external sound may be adjustable by the user via controls on the headset 100.

Unlike the air conduction, bone conduction delivers sound to the user's inner ear via vibrations in the user's cranial bones. For example, bone conduction is a primary manner in which one hears one's own voice. As shown in the Figures, a bone-conduction transducer 124 is included to convert audio signals from the audio signal source 110 to vibrations in the human body. In particular, the bone-conduction transducer 124 is designed generate vibrations in a cranial bone 126 of the user. In different situations, the bone-conduction transducer 124 may be placed against with the user's body, as shown, or implanted inside the body. The vibrations in the cranial bone 126 may be detected by the bony cochlea chamber 134 of the inner ear, which is communicated to the auditory cortex 136, resulting in an auditory sensation to the user. The bone conduction pathway thus bypasses the normal auditory pathway of the outer and middle ear.

The headset 100 may include multiple bone-conduction transducers 124. For example, the headset 100 may include two bone-conduction transducers 124, one for each side of the user's face. In other examples, more than two bone-conduction transducers 124 may be used for different bones. For example, one embodiment of the headset 100 may employ four separate bone-conduction transducers 124 placed on four different points on the user's head. Bone-conduction transducers may be placed any location on the user's head. The locations are preferably close and fixed relative to the underlying cranial bones and the cochlea chamber in the user's head. For example, one location for the bone-conduction transducer may the mastoid portion of the temporal bone of the human skull, which is located just behind the ear. This location is proximal to the mastoid process, which is located just behind the middle ear. Research has shown that other locations on the head with high bone-conduction sensitivity include the forehead, the vertex or top of the head, and various locations on the side of the face, in particular near the temple or the ear. In some embodiments of the headset 100, the location may be selectable by the user. For example, the headset 100 may permit an adjustable number of bone-conduction transducers to be added, each designed to contact a particular portion of the head. The headset 100 may deliver the audio signals, or different components of the audio signals, to each of the bone-conduction transducers and/or audio conduction transducers approximately at the same time, to provide the user a multimode listening experience. In some embodiments, the different components may be processed (e.g., by shifting the relative time of the components), so as to provide a stereophonic sound to the user. The different components of the audio signal provided to the transducers may be configured by the user to improve balance and synchronization among the transducers.

In some embodiments, the headset 100 may further include a microcontroller 140. The microcontroller 140 may comprise a computer implemented on an integrated circuit. The microcontroller 140 may include software code configured to operate and configure various aspects of the headset 100. For example, the microcontroller 140 may implemented a digital signal processor (DSP) to perform signal processing on received audio signals. In embodiments where the audio signals are received in analog form, the microcontroller 140 may employ an analog-to-digital converter (ADC) to convert the analog signals to digital form. The microcontroller 140 may then perform a number of signal processing operations on the digital signals. In some embodiments, the microcontroller 140 may implement a number of filters to separate the audio signals into different frequency components. The different frequency components may be processed differently, before they are recombined and/or forwarded to the various air or bone-conduction transducers. In embodiments, the digital signals may be converted back to analog signals using a digital-to-analog converter (DAC) to drive the various transducers. In some embodiments, certain transducers on the headset 100 may only receive some subset of frequency band components of the audio signal. For example, in some cases, higher frequency components are forwarded to the air-conduction transducers 120, while lower frequency components are forwarded to the bone-conduction transducers 124.

The processing of the components of the audio signals may include a number of operations that will be discussed in further detail in connection with FIGS. 2 and 3. In particular embodiments, the dynamic range of a component may be reduced using an audio compressor. That is, the audio compressor may reduce the volume of loud sounds in the audio signals or amplify the soft sounds in the audio signals. This compression of the audio signals may reduce the tickling sensation that is generated by the bone-conduction transducers.

In some embodiments, different components of the audio signals may be compressed differently using different input-output transfer functions. Studies have shown that the tactile sensations produced by bone-conduction transducers are frequency-dependent. In particular, lower frequency signals may produce more significant tactile sensations in a user than higher frequency signals. Accordingly, in some embodiments, a compressor for low frequency audio signal components may be set to compress the dynamic range of those components more aggressively than high frequency components. The individual compressor settings may be set initially by the manufacturer of the headset 100, and then subsequently adjusted by the user using psychophysical calibration techniques. For example, the headset 100 or an accompanying device may be programmed to perform a psychophysical test on the user by generating sounds at different frequencies and intensities to the user. The user may then provide feedback as to the amount of tactile sensation that was experienced. Based on the feedback response, the headset 100 may calibrate the settings for the compressors or the microcontroller 140 to provide a more comfortable listening experience for the user.

Another signal processing operation that may be performed on the audio signal components is equalization. In this operation, the intensity of different frequency components within the audio signal are adjusted. Such adjustments may be made for tone control or for aesthetic reasons, or technically by measurement. Equalization may be performed using an equalizer that is implemented separately or as part of the DSP processor on the microcontroller 140. Equalization and compression may both be used to achieve a better balance of the loudness of sounds generated by the different transducers, producing a more comfortable listening experience to the listener.

To properly equalize the sounds from two different types of transducers, a psychophysical calibration may be performed to determine the user's response to stimuli from both transducers. For example, in one calibration method, two phase cancelling signals may be transmitted at different volumes via the two conduction paths to the user. The user would then provide feedback to report the point at which the two signals are perceived to perfectly cancel one another. This point thus represents a loudness matching of the two types of transducers. The results of such psychophysical calibration may be used to define a set of equivalence loudness levels between the two types of transducers, in terms of input energy. The equivalence loudness level may then be used to equalize audio signals between the two types of transducers. Similar psychophysical calibration techniques may be used to achieve a balancing between different bone-conduction transducers on the headset 100. In particular, some locations on the cranium may be more sensitive to sound conduction than other locations. Such differences may be accounted for through equalization.

In some embodiments, the headset 100 may include user controls 150 that allow the user to dynamically adjust parameter settings of the DSP and/or the microcontroller 140. For example, user controls 150 may include physical control elements such as switches, knobs, or dials. The control elements may perform functions such as powering on or off the headset 100 or particular elements (e.g., transducers) on the headset 100. The control elements may also allow the user to adjust operating setting of the headset 100, such as the volume of particular transducers, the frequency range assigned the different transducers, and various other settings of the audio compressors and equalizers. In some embodiments, some of the user controls 150 may be accessible via a software user interface. For example, the headset 100 may be coupled with an accompanying computing device, such as a smartphone, and an application on the smartphone may allow the user to configure various settings of the headset 100. As another example, the headset 100 may include a visual display (e.g., in a pair of glasses) and a microphone capable of receiving audio commands from the user. These features of the headset 100 may be used to configure the headset's audio settings.

Figure 2:
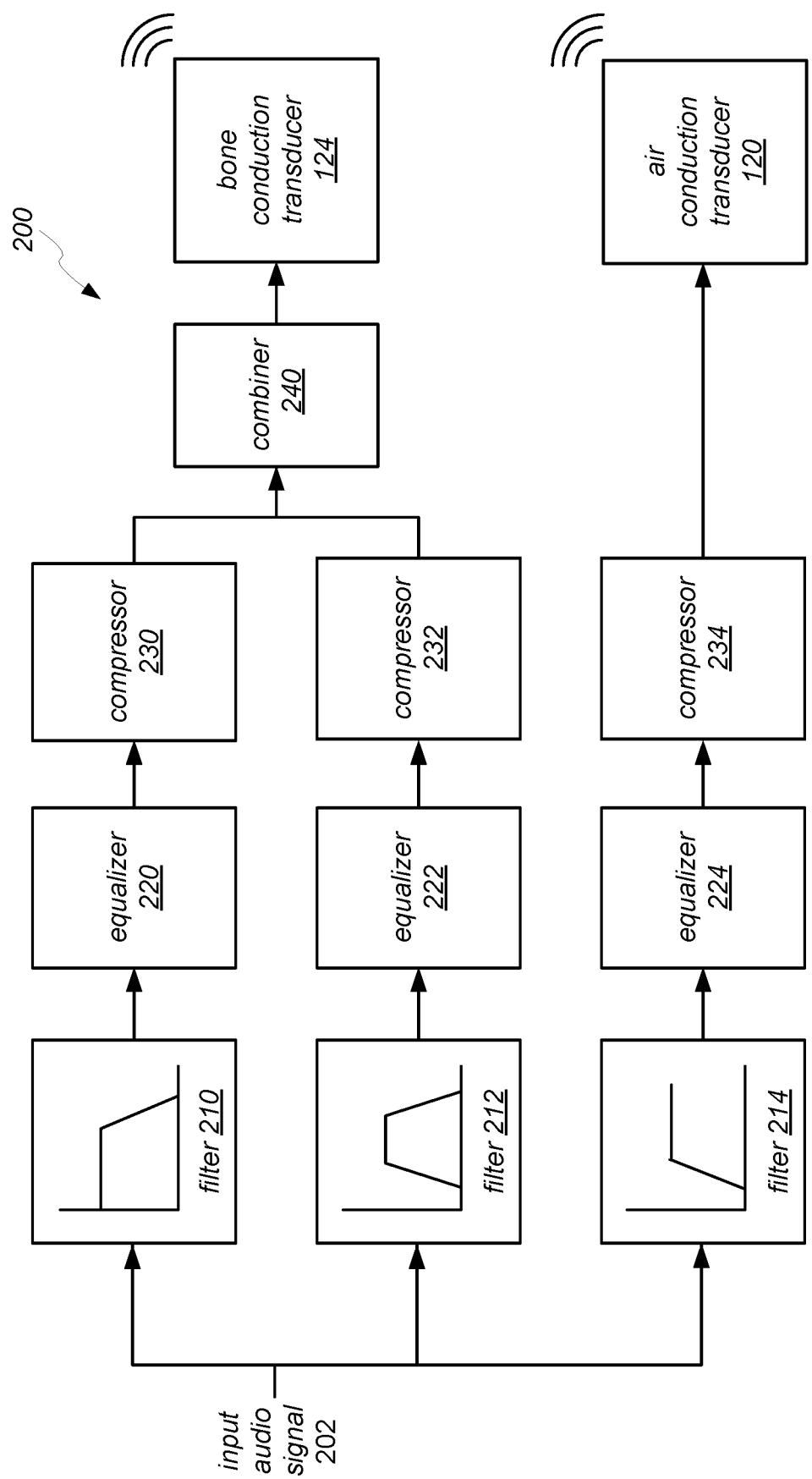
FIG. 2 illustrates components used to process audio signals delivered via an air-conduction transducer and a bone-conduction transducer, according to some embodiments.

FIG. 2 illustrates components used to process audio signals delivered via an air-conduction transducer and a bone-conduction transducer, according to some embodiments. Some of the components of FIG. 2 may be implemented as analog devices. Alternatively, the components may be implemented as portions in a digital signal processor (DSP). In some embodiments, the DSP may be implemented as a part of the microcontroller 140, as discussed in connection with FIG. 1.

As shown in the FIG. 2, input audio signal 202 is received. The input audio signal 202 may be received from an audio signal source 110, as discussed in connection with FIG. 1. The input audio signal 202 may then be processed filters 210, 212, and 214, to produce three different frequency band components of the input audio signal 202. Filter 214 may be configured to produce a high-frequency component of the audio signal 202, filter 212 a mid-frequency component, and filter 210 a low frequency component. The high-frequency component may be transmitted to a driver for the air-conduction transducer 120, while the mid- and low-frequency components may be transmitted to a driver for the bone-conduction transducer 124. In embodiments, components that are provided to the bone-conduction transducer are limited to frequency ranges below 4,000 Hz, as the effectiveness of bone conduction decreases significantly at frequencies higher than the threshold. In some embodiments, the bone-conduction transducer is used to transmit bass components, which are generally understood to include frequencies lower than 250 Hz. The audio signal provided to the bone-conduction transducer may be further divided into two or more subcomponents. For example, in the Figure, the filters produce a low-frequency and a mid-frequency frequency component that are transmitted to the bone-conduction transducer. In alternate embodiments, only one component or more than two subcomponents may be transmitted to the bone-conduction transducer. By dividing the bone-conduction transducer components into multiple subcomponents, the subcomponents may be processed differently. For example, because the tactile sensation generated by the bone-conduction transducer are more noticeable at lower frequencies, the apparatus may employ a more aggressive audio compressor with a flatter compression slope to compress that component. The apparatus thus implements a flexible signal processing procedure, depending on the frequency of the audio signal component.

The filters 210, 212, and 214 may be configured to allow a particular range of frequencies of audio signal 202 to pass through, while at the same time inhibiting other ranges of frequencies. The filter may progressively attenuate the audio signal 202 in frequencies outside of the pass band. In some cases, the filter may amplify the audio signal 202 in the frequency range of the filter's pass band. The frequency ranges may be selected such that they fall within the transduction capabilities of the transducer. The frequency ranges may also be selected so that they correspond roughly to the standard bass (30-250 Hz), midrange (250-2000 Hz), and treble (2-16 kHz) ranges as generally used in the sound equipment industry. In one preferred embodiment, filter 210 may be configured to produce a pass band of approximately 60 Hertz and below, filter 212 may be configured to produce a pass band of approximately 60 to 250 Hertz, and filter 214 may be configured to produce a pass band of approximately 250 Hertz and above. Different types of audio content may have different dynamic frequency ranges, which may be assigned to appropriate transducers. For example, human speech typically falls within the frequency range of 85 Hz to 8 kHz. This particular range may be isolated using one or more filters so that these audio signal components may be processed separately. As would be understood by a person of ordinary skill in the art, however, different frequency ranges may be used in other embodiments.

The filters may be implemented or configured as one or more active audio crossovers. In a preferred embodiment, filters 210 and 214 may be implemented using or configured as a 4th order Butterworth squared filter or a 4th order Linkwitz-Riley crossover (LR4), and filter 212 may be implemented using or configured as two 4th order Butterworth squared filters or two 4th order Linkwitz-Riley crossover (2×LR4). These filters are designed to achieve a flat frequency response in the pass band and sufficiently steep roll off in the stop band. However, in other embodiments, different types of filters may be used and additional numbers of frequency band components may be produced.

In some embodiments, the different frequency components produced by the filters may be further processed by three respective equalizers 220, 222, and 224. The equalizers 220, 222, and 224 may be implemented using analog devices or programmed using one or more digital signal processors, as discussed in connection with FIG. 1. During equalization, the intensity of different frequency components within the audio signal may be adjusted. Such adjustments may be used for controlling the tone of the input audio signals 202. In a setting where one or more bone-conduction transducers 124 are used, equalizers 220 and 222 may be used to attenuate components of the audio signals so as to reduce any tactile sensation caused by those transducers. In different embodiments, the equalizers 220, 222, and 224 may be configured to process the audio signal at different points in the signal processing procedure. Equalization may take place before or after a compression of the dynamic range of the audio signal. In some embodiments, the equalizers 220, 222, and 224 may be configured as a group to enhance the overall balance among all transducers on the apparatus. The equalizers 220, 222, and 224 may be configurable via user controls 150 or a different user interface, which may be accessible via the headset 100 or some other device, as discussed in connection with FIG. 1.

In some embodiments, the different frequency components may be process by audio compressors, such as compressors 230, 232, and 234 shown in FIG. 2. The compressors 230, 232, and 234 may be implemented using analog devices or programmed using one or more digital signal processors, as discussed in connection with FIG. 1. During audio compression, the dynamic range of the respective audio signal components produced by the filters is reduced. The compressors may attenuate softer sounds in the audio signal component and/or amplify louder sounds in the audio component to narrow the intensity range of the component. Each compressor 230, 232, and 234 may compress its respective component different, according to a respective input-output transfer function. The input-output transfer function generally specifies the relationship between the input power of an incoming audio signal and the output power of the outgoing audio signal. The compression of the audio signal components may take place any different points during the signal processing procedure. In some embodiments, audio compression may occur after an equalization of the respective audio signal components. In some embodiments, the equalizer and the compressor may comprise a single physical circuit or logical unit in a DSP.

For audio signal components that are to be delivered via a bone-conduction transducer 124, the compressor may attenuate the audio signal to reduce the tactile sensation that may be generated by the transducer. The individual compressor settings may be set initially by the manufacturer of the apparatus, and then subsequently adjusted by the user using psychophysical calibration techniques. For example, a headset 100 or an accompanying device may be programmed to perform a psychophysical test on the user by generating sounds at different frequencies and intensities to the user. The user may then provide feedback as to the amount of tactile sensation that was experienced. Based on the feedback response, the headset 100 may determine particular setting for the compressors 230 and 232, for example the compression threshold and/or the compression ratio of these compressors. These compressors may be calibrated accordingly to provide a more comfortable listening experience for the user. The compressors 230, 232, 234 may be further configurable via user controls 150 or a different user interface, which may be accessible via the headset 100 or some other device, as discussed in connection with FIG. 1.

In some embodiments, different components of the audio signal components may be recombined using a combiner. For example, as shown, the low-frequency and mid-frequency components of the audio signal 202 may be combined using combiner 240. The combiner 240 may be implemented using analog devices or programmed using one or more digital signal processors, as discussed in connection with FIG. 1. In some alternative embodiments, the combiner 240 may aggregate more than two frequency components to produce the combined signal for the bone-conduction transducer. In other alternative embodiments, the component of the audio signal 202 provided to the air-conduction transducers may also be separated into subcomponents for separate processing, and a second combiner may be used to recombine those subcomponents for the air-conduction transducer. In some embodiments, the combiner 240 may perform further balancing of the incoming audio signals, such as amplitude or phase balancing.

Figure 3A:
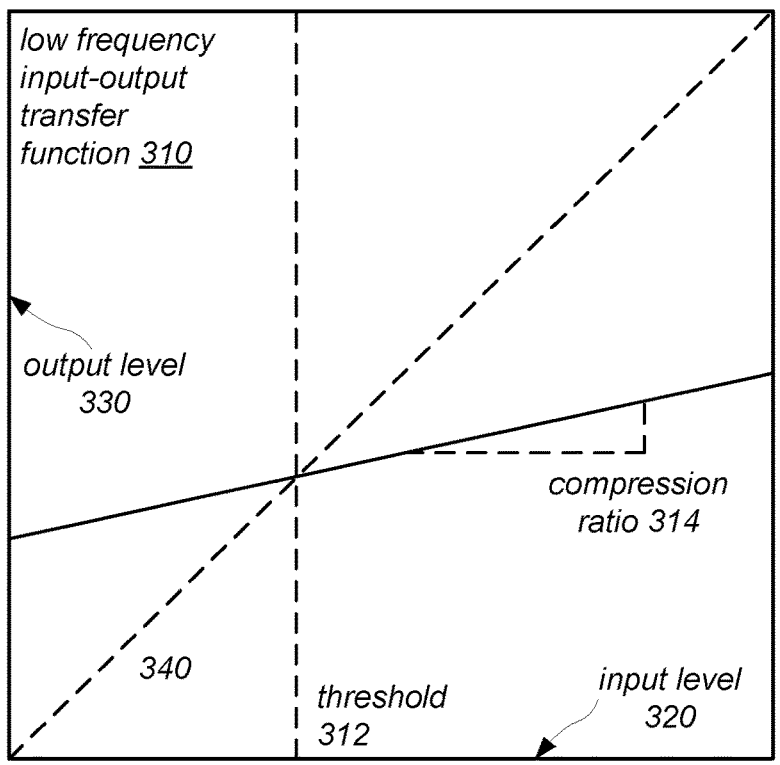
FIGS. 3A, 3B, and 3C illustrate example input-output transfer functions for different audio signal components generated for an air-conduction transducer and a bone-conduction transducer, according to some embodiments.
Figure 3B:
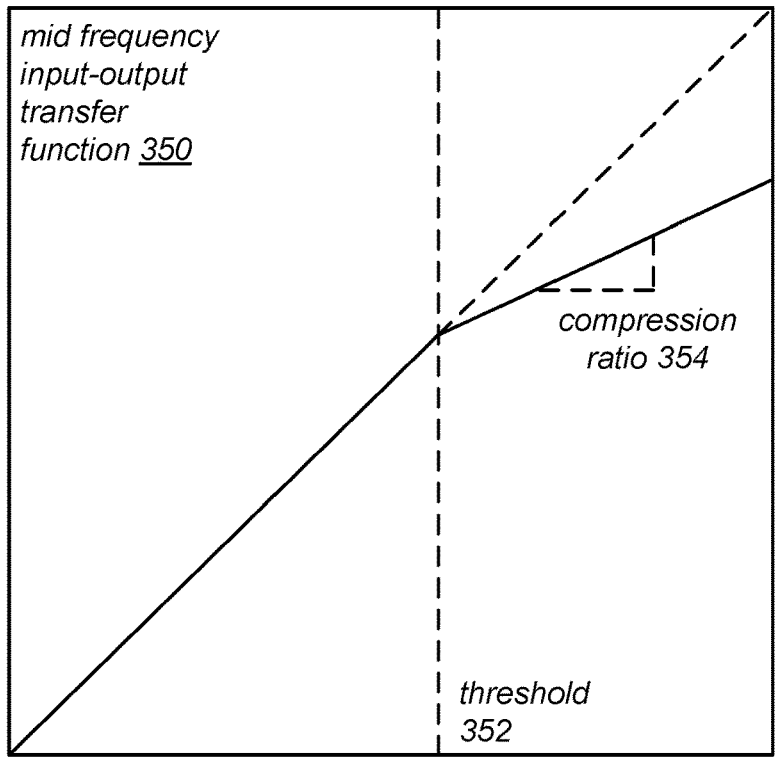
Figure 3C:
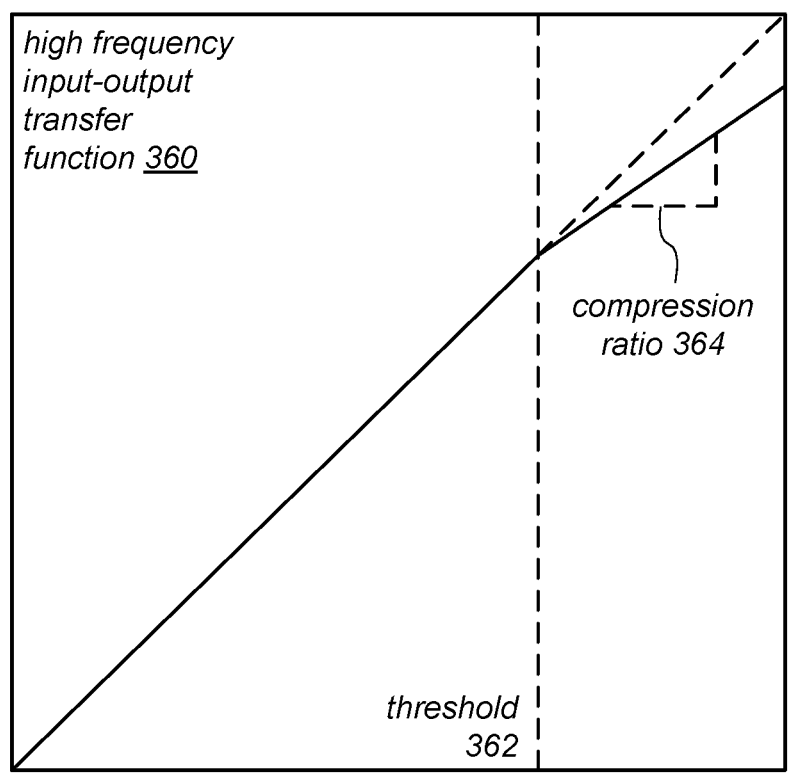

FIGS. 3A, 3B, and 3C illustrate example input-output transfer functions for different audio signal components generated for an air-conduction transducer and a bone-conduction transducer, according to some embodiments. These input-output transfer functions specify the compression characteristics of the audio compressors that are used in the apparatus, such as the headset 100 of FIG. 1. As illustrated, the low-frequency input-output transfer function 310 may correspond to the compressor 230 for the low-frequency component in FIG. 2, the mid-frequency input-output transfer function 350 may correspond to the compressor 232 for the mid-frequency component, and the high-frequency input-output transfer function 360 may correspond to the compressor 234 for the high-frequency component. In the Figures, for example FIG. 3A, the horizontal axis 320 represents the level of input power of the signal provided to the compressor. The vertical axis 330 represents the level of output power of the signal generated by the compressor. For example, the horizontal axis and 320 and vertical axis 330 may expressed in terms of decibels. The dotted line 340 in FIG. 3A represents the input-output transfer function where no audio compression is applied to the signal, where the output level of the signal simply equals to the input level.

In FIG. 3A, the low-frequency input-output transfer function 310 is represented by the solid sloped line in the graph. Transfer function 310 may specify a compression threshold 312 and a compression ratio 314. The compression threshold 312 may specify an input level above which the compressor begins to modify the incoming signal's intensity level. In some embodiments where an expansion of the dynamic range is employed, as is the case for transfer function 310, the threshold 312 may specify the input level below which expansion is applied. Expansions of the dynamic range may be used for some range of low frequencies that are provided to the bone-conduction transducer at very low power levels, because human sensitivity for low-frequency sounds are generally lower than for high-frequency sounds, and at low intensity levels, the tickling sensations from the bone-conduction transducer may not be significant. In some cases, the threshold for an expansion and reduction of the dynamic range may be the same value. For example, in the transfer function 310, the threshold point 312 serves both an ending point for a dynamic range expansion for frequencies below that point, and also a beginning point for a dynamic range reduction for frequencies above that point. In some cases, multiple levels of audio compression may be used for different ranges of input intensity levels, and accordingly, the transfer function may include multiple threshold points.

The compression ratio 314 represents the amount of gain reduction or increase that is produced by the compressor, given some amount of change in the intensity level of the input signal. For example, a compression ratio of 4:1 means that for every four decibels of increase that is seen in the input audio signal, the compressor reduces the intensity of the output signal by one decibel. In embodiments where both an expansion and a reduction of the dynamic range are implemented by the compressor, the compressor may employ two different respective compression ratios. In some embodiments, the compressor may implement multiple compression ratios for multiple ranges of input intensity levels, using multiple threshold points.

FIG. 3B illustrates an exemplary input-output transfer function 350 of a mid-frequency component of the audio signal. In the transfer function 350, only a reduction of the dynamic range is employed. The compression begins at threshold 352, and at a compression ratio of 354. In some embodiments, the compression ratio 354 of a mid-frequency compressor may be lower than the compression ratio of a lower frequency compressor, for example the compression ratio 314. The tactile sensation from bone conduction is greater at lower frequencies. Accordingly, lower frequency components of the audio signal may need to be compressed more aggressively than higher frequency components. Moreover, the threshold 352 of a mid-frequency compressor may be set lower than the threshold 312 of a lower frequency compressor. This is because the tactile sensations from bone conduction may be felt at lower power levels for lower frequency sounds. In alternative embodiments where the bone conduction component of the audio signal includes more than two subcomponents, each subcomponent may be compressed with a different respective compressor, which progressively increases the compression threshold and decreases the compression ratio for higher frequency components.

The apparatus may allow the user to individually configure the compressor settings for the multiple compressors to fine tune the device for listening comfort. The settings may be adjusted by for example the user controls 150 as discussed in connection with FIG. 1, or a software user interface accessible via the headset 100 or another computing device. In addition to the compressor threshold(s) and or compressor ratio(s), other settings of the compressor may be configurable by the user. For example, some embodiments of the apparatus may allow the user to adjust the attack and release times of the compressor, which relate to how quickly the compression begins after a triggering signal is detected. In some embodiments, the user may be able to adjust the softness of the "knee" that occurs at the threshold point. A soft knee at the threshold point means a gradual increase or decrease of the compression ratio around the threshold point. A soft knee avoids the abrupt effects of the compressor when the input level of the audio signal transitions between two compression ratios. In some embodiments, the compressors of the headset 100 employ an attack time of one millisecond or less, and a release time of 50 milliseconds or less. In preferred embodiments, the compressors employ soft knees at the compression thresholds.

FIG. 3C illustrates another exemplary input-output transfer function 360 for a high-frequency component of the audio signal. Transfer function 360 may correspond for example compressor 234 for the air-conduction transducer 120, as discussed in FIG. 2. As illustrated, transfer function 360 includes a threshold 362 and a compression ratio 364. In embodiments, the threshold 362 may be higher than the thresholds of lower frequency compressors, such as thresholds 312 and 352 in FIGS. 3A and 3B. In embodiments, the compression ratio 364 may be lower than the compression ratios of lower frequency compressors, such as ratios 314 and 354 in FIGS. 3A and 3B. In some embodiments of the apparatus, the air-conduction transducer component(s) may not be compressed using any audio compressors. Only the components provided to the bone-conduction transducer 124 may be compressed.

Figure 4A:
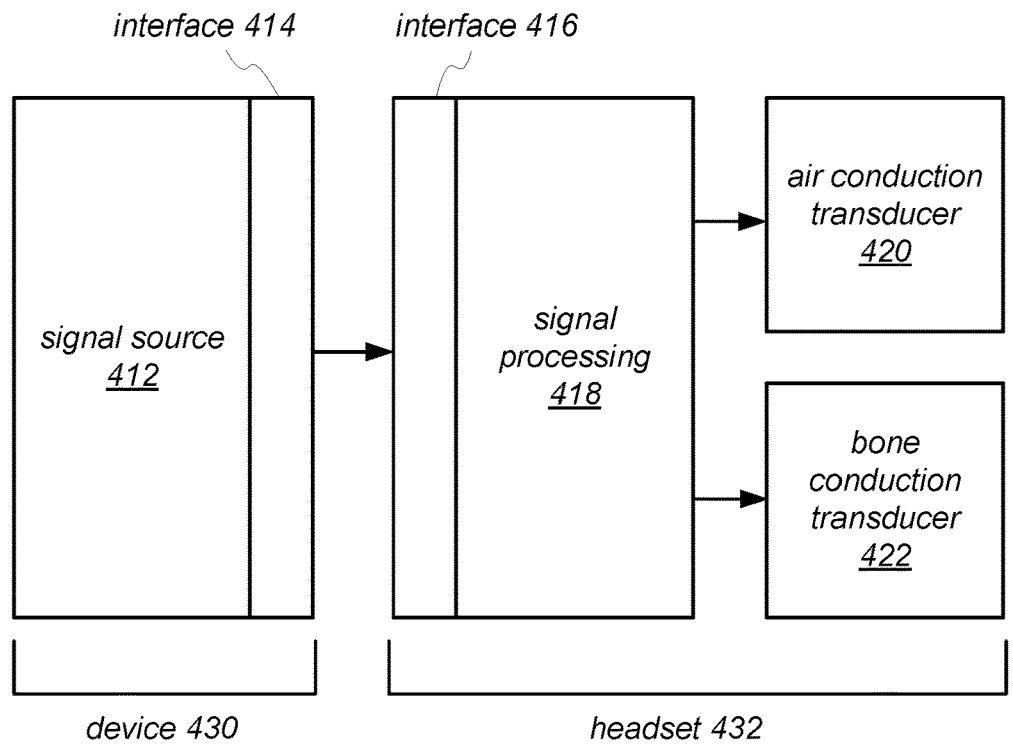
FIGS. 4A and 4B illustrate two example embodiments of an apparatus that delivers audio signals via an air-conduction transducer and a bone-conduction transducer, according to some embodiments.
Figure 4B:
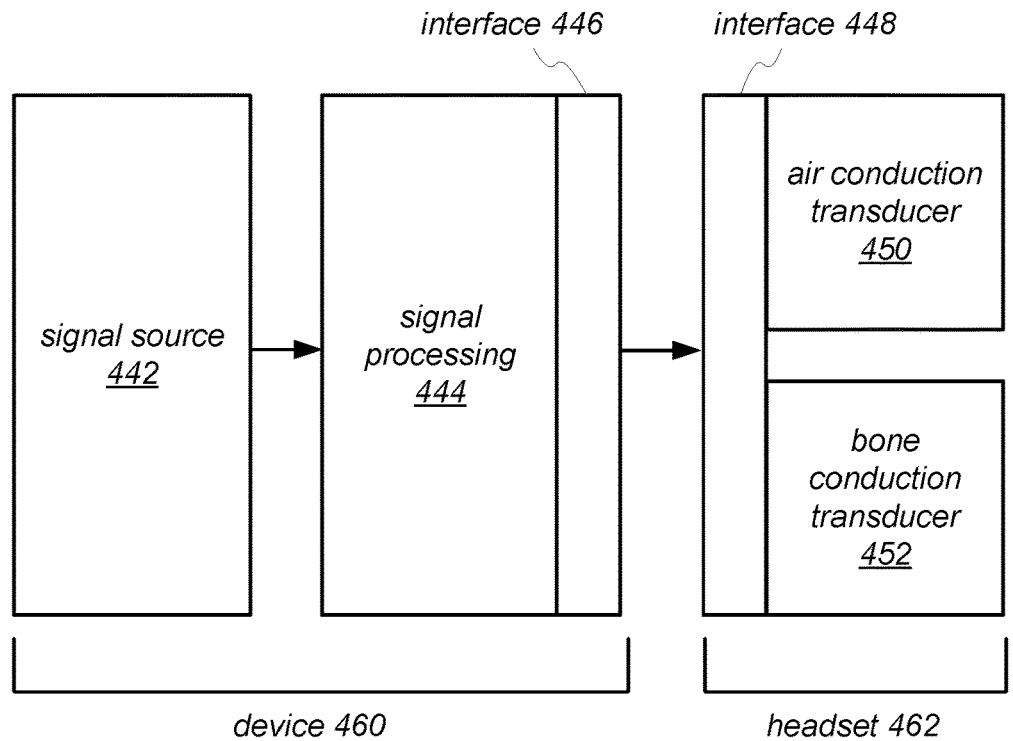

FIGS. 4A and 4B illustrate two example embodiments of an apparatus that delivers audio signals via an air-conduction transducer and a bone-conduction transducer, according to some embodiments. FIG. 4A depicts an exemplary embodiment where at least a portion of the signal processing components 418 reside in the headset 432 that includes the air-conduction transducer 420 and the bone-conduction transducer 422. In this embodiment, the signal source 412 may be a separate device 430 from the headset 432. The device 430 and the headset 432 may communicate via respective interfaces 414 and 416. For example, the device 430 may comprise a smartphone, a music player, or a computer. The interfaces 414 and 416 may comprise the output and input ports of a physical wire, such as a speaker, telephone, or data cable, or a wireless connection. The wireless connection may comprise a data connection capable of transmitting digital sound signals, such as a Bluetooth, WiFi, or cellular connection. In the embodiment of FIG. 4A, device 430 may not be adapted for generating audio signals that are adapted for air and bone-conduction transducers 420 and 422. Rather, the headset 432 may accept the input audio signals, perform signal processing on the signals including splitting the signals into respective air and bone conduction components, and then delivering the respective signals to the user via the transducers. In this embodiment, the headset 432 may include specialized DSP hardware and/or software that are adapted to working with the air and bone-conduction transducers 420 and 422 on the headset.

FIG. 4B depicts another exemplary embodiment where at least a portion of the signal processing components 444 reside in the device 450 that includes the signal source 442. In this embodiment, the interfaces 446 and 448 may represent the output and input ports between the device 460 and the headset 462. The interfaces 446 and 448 may implement a special channelized interface that specify different channels for the air-conduction transducer 450 and bone-conduction transducer 452 on the headset 462. In some embodiments, the interface 446 and 448 may be an existing interface for channelized audio signals, such as the connection interface for an audio mixer or a type of surround sound system. In other embodiments, the interface 446 and 448 may implement a general data interface, such as the IP protocol, that implements a specialized high-level transmission protocol for the headset 462. In the embodiment of FIG. 4B, the device 460 may use the signal processing components 444 to generate component audio signals that are adapted to be delivered by the headset 462. For example, the device 460 may be a smartphone, a computer, or gaming console that includes specialized driver software to operate with the headset 462.

In both embodiments in FIGS. 4A and 4B, the signal processing components 418 and 444 may be configurable by the user. For example, where in the signal processing occurs on the headset 432, the headset 432 may be configurable by an accompanying device running configuration software, such as a computer or a smartphone. In the case where the signal processing is performed on the device 460, the configuration software may be included as part of the driver software on the device 460. The configuration software may permit the user to adjust various signal control settings for the signal processing components 418 or 444. For example, the configuration software may allow the user to adjust settings such as the equalization profile for the different equalizers. The configuration software may also allow the user to adjust the settings for the compressors, such as the compression ratio and threshold, and attack and release times. In some cases, the configuration software may adjust the settings for transducers on opposite sides of the head differently. For example, a user who is less sensitive to bone conduction on the left side of her face may use more aggressive compressor for the bone-conduction transducer on the left side.

In some embodiments, the headset settings may be specific to a particular user or device. For example, the signal source device and headset may be configured to recognize one another, via a setup protocol, when they are first connected. After recognition, either the device or the headset may apply a set of parameters that were previously saved for signal processing components. For example, a headset may recognize when it is connected to a particular smartphone, which is associated with a particular set of audio parameters. The headset may then retrieve or receive these parameters, and apply them to the signal processing components. The parameters may be saved on the device, the headset, or on a remote server maintaining an account for the user.

In other embodiments, audio parameter settings may be associated with types of content. For example, different equalizer and/or compressor settings may be associated with phone calls, as opposed to music. Because phone calls do not generally include sounds at the higher end of the audible spectrum that occur in music, the compressors and equalizers may be configured differently to dispense with any processing performed to enhance the balance between low- and high-frequency audio signals. Particular sets of settings may also be associated with particular content, such as particular radio stations or songs. These settings may be user configuration and stored in a configuration data repository with the content. The settings may be applied when the content is played.

Figure 5:
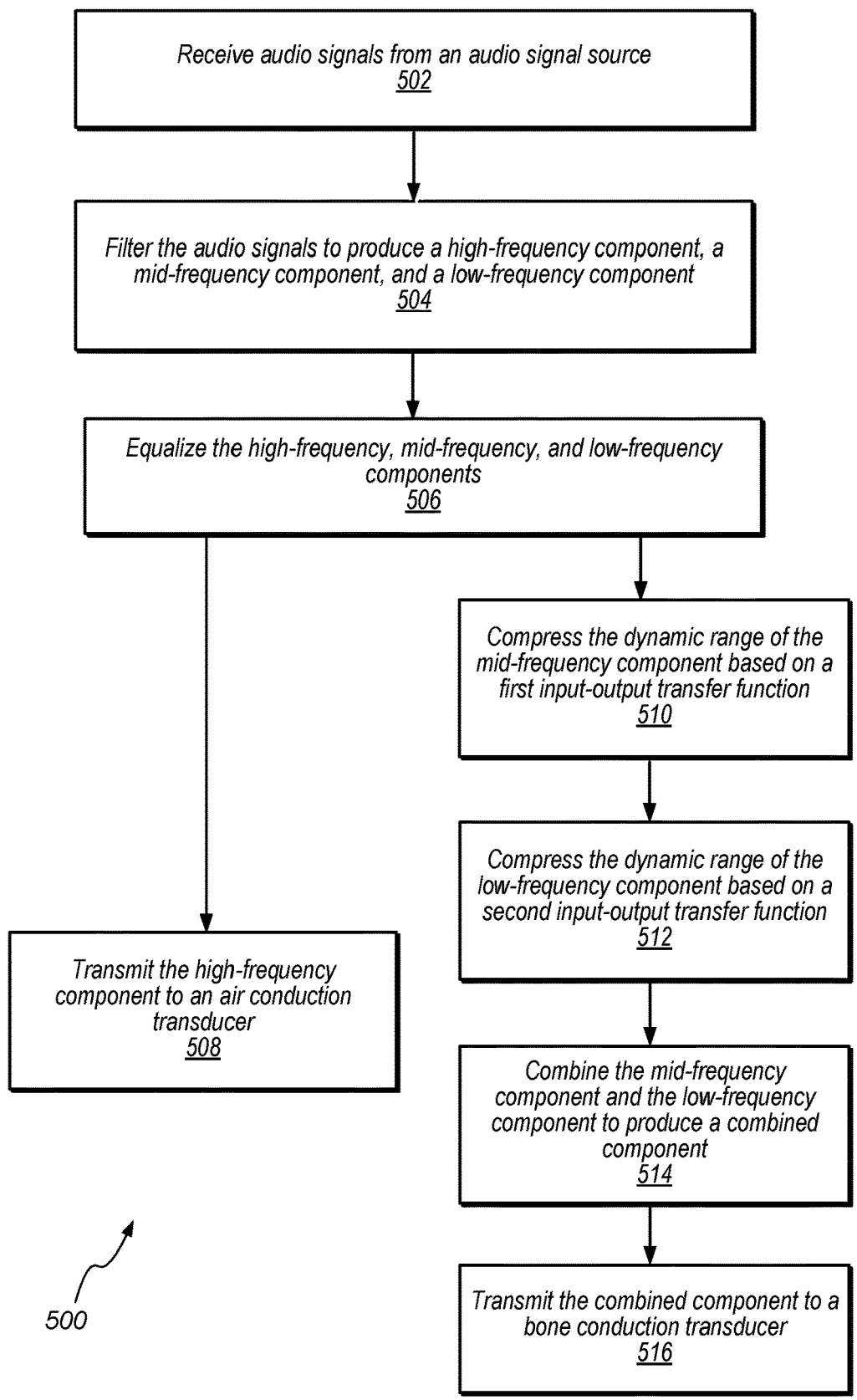
FIG. 5 is a flow diagram that illustrates operations performed by an apparatus that includes an air-conduction transducer and a bone-conduction transducer, according to some embodiments.

FIG. 5 is a flow diagram that illustrates operations performed by an apparatus that includes an air-conduction transducer and a bone-conduction transducer, according to some embodiments. Process 500 begins at operation 502, where audio signals are received from an audio signal source. Operation 502 may be performed by a headset, for example headset 100 as discussed in connection with FIG. 1. Alternatively, operation 502 may be performed by a device separate from the headset, for example device 460 as discussed in connection with FIG. 4B.

At operation 504, the audio signals are filtered to produce a high-frequency component, a mid-frequency component, and a low-frequency component. In some embodiments, only two components may be generated from the filters, one for the air-conduction transducer and one for the bone conduction transducer. In some other embodiments, more than three components may be produced as the result of the filtering. The filters may be parts of an audio crossover network, and may be implemented either as analog circuits or as part of a DSP. In one preferred embodiment, the high- and low-frequency components may be produced by a respective 4th order Butterworth squared filter or a 4th order Linkwitz-Riley crossover (LR4), and the mid-frequency component may be produced by two 4th order Butterworth squared filters or two 4th order Linkwitz-Riley crossover (2×LR4). In one preferred embodiment, filters may be configured to produce a low-frequency component of approximately 60 Hertz and below, a mid-frequency component of approximately 60 to 250 Hertz, and high-frequency component of approximately 250 Hertz and above.

At operation 506, the high-, mid-, and low-frequency components are equalized. The equalization may be performed by separate equalizers implemented as analog circuits or as part of a DSP. The equalization may be performed by the headset 100, or a separate computing device such as device 460. The equalizers may comprise three separate equalizers or a single equalizer configured to balance the three audio signal components globally. The equalization may take place before or after a compression of the dynamic range of the audio signal components. In some embodiments, the equalization may be performed by adjusting the amplitude of the various audio signal components to achieve a balance between the air-conduction transducer and bone-conduction transducer, according to an equivalent loudness function of the two transducers that is determined using a psychophysical calibration by the user.

At operation 508, the high-frequency component of the audio signal is transmitted to an air-conduction transducer. The air-conduction transducer may be air-conduction transducer 120 as discussed in connection with FIG. 1. The high-frequency component may be transmitted to two air-conduction transducers attached to a headset, one for each ear of the user. The air-conduction transducers may be configured such that they do not substantially block the user's ear canal, thereby allow the user to hear external noises from the surrounding environment. In some cases, the air-conduction transducer may be shaped with an opening to allow external noises to reach the user's ear canal.

At operations 510 and 512, the dynamic ranges of the mid- and low-frequency components are compressed based on a first and a second input-output transfer function, respectively. The compression may be performed by two audio compressors, which may be implemented as analog components or as part of a DSP. The compression may be performed by the headset 100, or a separate computing device such as device 460.

The compression may be performed to balance the loudness of the bone-conduction transducers with the other transducers on the headset. The compression may also be performed to reduce the tactile sensation generated by the bone-conduction transducers, which may be prominent at low-frequency ranges and at high intensity levels. The degree of compression may be calibrated according to psychophysical testing performed by the headset's manufacturer or user. The compression may take place before or after the equalization the audio signal components. In some embodiments, the compression ratio employed on the low-frequency component is higher than the compression ratio employed on the mid-frequency component. In some embodiments, the compression threshold of the low-frequency compressor is lower than the compression threshold of the mid-frequency compressor. In some embodiments, the compressors may be configured to increase the amplitude of the input signal at low intensity levels. In some embodiments, the compressors may be configured with an attack time of one millisecond or less, and a release time of 50 milliseconds or less. In preferred embodiments, the compressors employ soft knees at the compression thresholds.

At operation 514, the mid- and low-frequency components of the audio signal are combined to produce a combined component. Operation 514 may be performed by a combiner such as combiner 240 as discussed in connection with FIG. 2. The combiner 240 may be implemented as analog circuits or as part of a DSP. In some embodiments, the combiner 240 may aggregate more than two frequency components to produce the combined signal for the bone-conduction transducer. In other alternative embodiments, multiple components of the audio signal may be combined by a second combiner to produce a combined signal for the air-conduction transducer. In some embodiments, the combiner may perform further balancing of the incoming audio signals, including amplitude or phase balancing.

At operation 516, the combined component is transmitted to a bone-conduction transducer. The bone-conduction transducer may be bone-conduction transducer 124, as discussed in connection with FIG. 1. In some embodiments, the combined component may be transmitted to multiple bone-conduction transducers attached to a headset, which are designed to contact different portions of the user's head. The bone-conduction transducers may be designed to convert audio vibrations into vibrations into different cranial bones of the user's body, including for example the portions of the temporal bone in front of and behind the user's ear, the cheek bone, sphenoid bone, the jaw bone, and/or the nasal bone. As discussed, a headset may deliver the audio signals, or different components of the audio signals, to each of the bone-conduction transducers and/or audio conduction transducers at approximately the same time, to provide the user a multimode listening experience. In some embodiments, the different components may be processed (e.g., by shifting the relative time of the components), so as to provide a stereophonic sound to the user.

Figure 6:
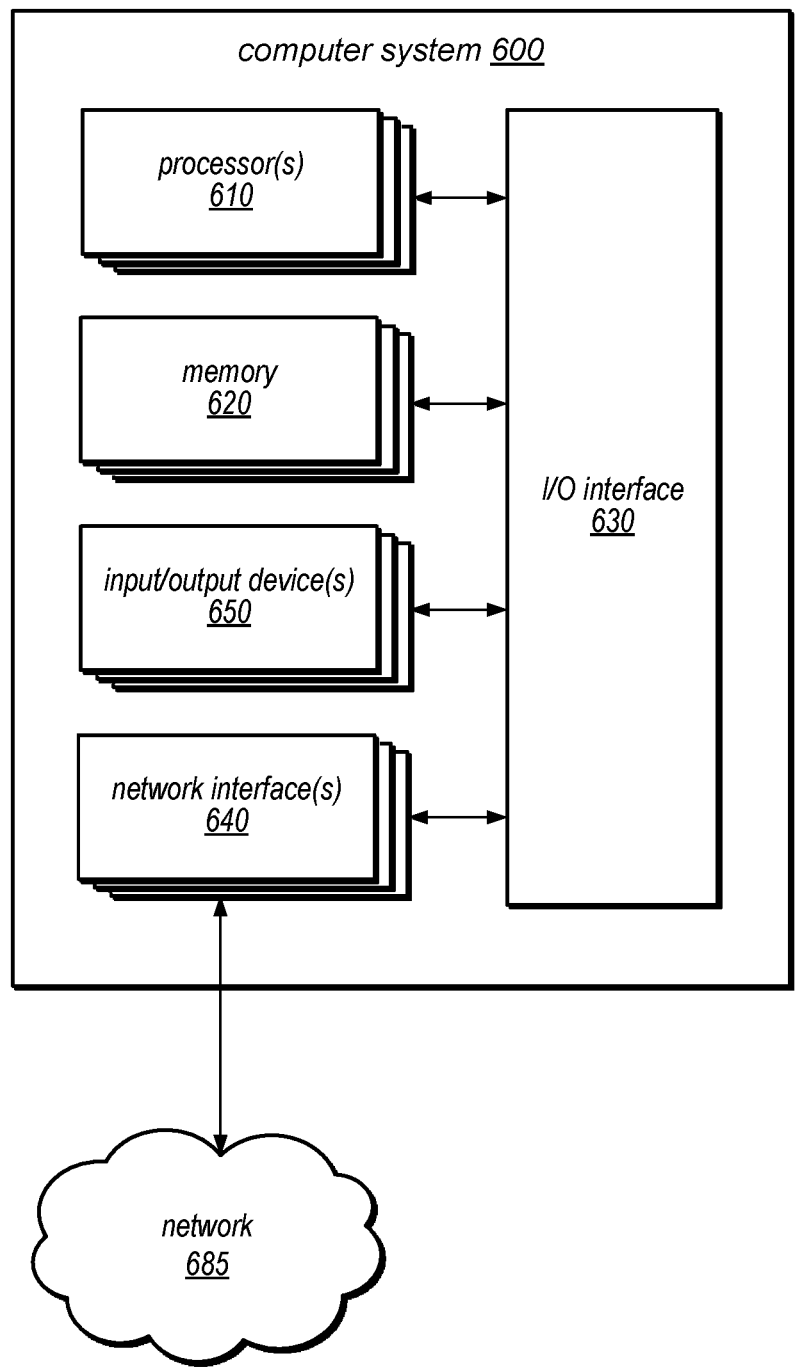
FIG. 6 illustrates a computer system that may be configured to implement, operate, or configure portions of an apparatus that includes an air-conduction transducer and a bone-conduction transducer, according to some embodiments.

FIG. 6 illustrates an example computer system 600 that may be configured to include or execute any or all of the embodiments described above. For example, the computer system 600 may implement microcontroller 140 on the headset 100, an accompanying device of the headset 100, or device 430 or 460 discussed in connection with FIGS. 4A and 4B. In different embodiments, the computer system 600 may be any of various types of devices, including, but not limited to, a personal computer system, desktop computer, laptop, notebook, tablet, slate, pad, or netbook computer, cell phone, smartphone, PDA, portable media device, mainframe computer system, handheld computer, workstation, network computer, a camera or video camera, a set top box, a mobile device, a consumer device, video game console, handheld video game device, application server, storage device, a television, a video recording device, a peripheral device such as a switch, modem, router, or in general any type of computing or electronic device.

Various embodiments of a sensor data-processing system as described herein, may be executed in one or more computer systems 600, which may interact with various other devices. Note that any component, action, or functionality described above with respect to FIGS. 1 through 5 may be implemented on one or more computers configured as computer system 600 of FIG. 6, according to various embodiments. In the illustrated embodiment, computer system 600 includes one or more processors 610 coupled to a system memory 620 via an input/output (I/O) interface 630. Computer system 600 further includes one or more network interfaces 640 coupled to I/O interface 630, and one or more input/output devices, which can include one or more user interface (also referred to as "input interface") devices. In some cases, it is contemplated that embodiments may be implemented using a single instance of computer system 600, while in other embodiments multiple such systems, or multiple nodes making up computer system 600, may be configured to host different portions or instances of embodiments. For example, in one embodiment some elements may be implemented via one or more nodes of computer system 600 that are distinct from those nodes implementing other elements.

In various embodiments, computer system 600 may be a uniprocessor system including one processor 610, or a multiprocessor system including several processors 610 (e.g., two, four, eight, or another suitable number). Processors 610 may be any suitable processor capable of executing instructions. For example, in various embodiments processors 610 may be general-purpose or embedded processors implementing any of a variety of instruction set architectures (ISAs), such as the x86, PowerPC, SPARC, or MIPS ISAs, or any other suitable ISA. In multiprocessor systems, each of processors 610 may commonly, but not necessarily, implement the same ISA.

System memory 620 may be configured to store program instructions, data, etc. accessible by processor 610. In various embodiments, system memory 620 may be implemented using any suitable memory technology, such as static random access memory (SRAM), synchronous dynamic RAM (SDRAM), nonvolatile/Flash-type memory, or any other type of memory. In the illustrated embodiment, program instructions included in memory 620 may be configured to implement some or all of an ANS, incorporating any of the functionality described above. Additionally, existing automotive component control data of memory 620 may include any of the information or data structures described above. In some embodiments, program instructions and/or data may be received, sent or stored upon different types of computer-accessible media or on similar media separate from system memory 620 or computer system 600. While computer system 600 is described as implementing the functionality of functional blocks of previous Figures, any of the functionality described herein may be implemented via such a computer system.

In one embodiment, I/O interface 630 may be configured to coordinate I/O traffic between processor 610, system memory 620, and any peripheral devices in the device, including network interface 640 or other peripheral interfaces, such as input/output devices 650. In some embodiments, I/O interface 630 may perform any necessary protocol, timing or other data transformations to convert data signals from one component (e.g., system memory 620) into a format suitable for use by another component (e.g., processor 610). In some embodiments, I/O interface 630 may include support for devices attached through various types of peripheral buses, such as a variant of the Peripheral Component Interconnect (PCI) bus standard or the Universal Serial Bus (USB) standard, for example. In some embodiments, the function of I/O interface 630 may be split into two or more separate components, such as a north bridge and a south bridge, for example. Also, in some embodiments some or all of the functionality of I/O interface 630, such as an interface to system memory 620, may be incorporated directly into processor 610.

Network interface 640 may be configured to allow data to be exchanged between computer system 600 and other devices attached to a network 685 (e.g., carrier or agent devices) or between nodes of computer system 600. Network 685 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 640 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices may, in some embodiments, include one or more display terminals, keyboards, keypads, touchpads, scanning devices, voice or optical recognition devices, or any other devices suitable for entering or accessing data by one or more computer systems 600. Multiple input/output devices may be present in computer system 600 or may be distributed on various nodes of computer system 600. In some embodiments, similar input/output devices may be separate from computer system 600 and may interact with one or more nodes of computer system 600 through a wired or wireless connection, such as over network interface 640.

Memory 620 may include program instructions, which may be processor-executable to implement any element or action described above. In one embodiment, the program instructions may implement the methods described above. In other embodiments, different elements and data may be included. Note that data may include any data or information described above.

Those skilled in the art will appreciate that computer system 600 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 600 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 600 may be transmitted to computer system 600 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g. SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. An apparatus, comprising:
   one or more filters configured to separate audio signals to produce a high-frequency component and a low-frequency component;
   a low-frequency compressor configured to reduce a dynamic range of the low-frequency component based at least in part on an input-output transfer function;
   an air-conduction transducer configured to convert the high-frequency component to air vibrations detectable by an ear of a user; and
   a bone-conduction transducer configured to convert the low-frequency component with the reduced dynamic range to vibrations in a cranial bone of the user via direct contact with the user, wherein said reduce the dynamic range of the low-frequency component based at least in part on the input-output transfer function attenuates components of the audio signal associated with tactile sensations.

2. The apparatus of claim 1, wherein the air-conduction transducer and the bone-conduction transducer are portions of a headset, and the low-frequency compressor is located on the headset.

3. The apparatus of claim 1, wherein the low-frequency compressor is implemented using one or more digital signal processors (DSP).

4. The apparatus of claim 1, wherein the air-conduction transducer and the bone-conduction transducer are portions of a headset, and the low-frequency compressor is implemented on a device distinct from the headset, the device providing a hardware interface to the headset.

5. The apparatus of claim 1, wherein the air-conduction transducer is configured to generate sounds into an ear cavity of the user without substantially blocking the ear canal from other sounds.

6. The apparatus of claim 1,
wherein the one or more filters are configured to separate the audio signals to produce a mid-frequency component;
wherein the apparatus further comprises:
a mid-frequency compressor configured to reduce a dynamic range of the mid-frequency component based at least in part on another input-output transfer function, wherein the input-output transfer function of the mid-frequency compressor implements a compression ratio that is lower than a compression ratio implemented by the input-output transfer function of the low-frequency compressor; and
a combiner configured to combine the mid-frequency component and the low-frequency component to produce a combined component;
and wherein the bone-conduction transducer is configured to convert the combined component to vibrations in a cranial bone of the user.

7. The apparatus of claim 6, wherein the input-output transfer function of the mid-frequency compressor implements a first compression threshold, the input-output transfer function of the low-frequency compressor implements a second compression threshold, and the first compression threshold is greater than the second compression threshold.

8. The apparatus of claim 6, wherein the combiner combines three or more frequency band components of the audio signals, including the mid-frequency component and the low-frequency component, wherein each component of the three or more components is compressed by a respective compressor.

9. The apparatus of claim 6, further comprising:
a first equalizer configured to equalize the high-frequency component;
a second equalizer configured to equalize the mid-frequency component; and
a third equalizer configured to equalize the low-frequency component.

10. The apparatus of claim 6, wherein the one or more filters attenuates frequencies below approximately 250 Hertz in the audio signals to produce the high-frequency component, frequencies above approximately 250 Hertz and below approximately 60 Hertz in the audio signals to produce the mid-frequency component, and frequencies above approximately 60 Hertz in the audio signals to produce the low-frequency component.

11. A method, comprising:
receiving, by a device comprising a bone-conduction transducer, audio signals from an audio signal source;
filtering the audio signals to produce a high-frequency component and a low-frequency component of the audio signals;
compressing a dynamic range of the low-frequency component based at least in part on an input-output transfer function configured to attenuate components of the audio signal associated with tactile sensations;
transmitting the high-frequency component to an air-conduction transducer; and
transmitting the low-frequency component to the bone-conduction transducer.

12. The method of claim 11, wherein transmitting the high-frequency component to the air-conduction transducer generates sounds into an ear cavity of a user without substantially blocking other sounds from the ear canal.

13. The method of claim 11, wherein compressing the dynamic range of the low-frequency component is performed using one or more digital signal processors (DSP).

14. The method of claim 11, further comprising:
prior to transmitting the high-frequency component to the air-conduction transducer, equalizing the high-frequency component; and
prior to transmitting the low-frequency component to the bone-conduction transducer, equalizing the low-frequency component.

15. The method of claim 11, further comprising:
wherein the filtering of the audio signals produces a mid-frequency component of the audio signals;
further comprising:
compressing a dynamic range of the mid-frequency component based at least in part on another input-output transfer function;
combining the mid-frequency component and the low-frequency component to produce a combined component;
and wherein the low-frequency component to a bone-conduction transducer comprises transmitting the combined component to the bone-conduction transducer.

16. The method of claim 15, where:
the input-output transfer function used to compress the dynamic range of the mid-frequency component implements a first compression ratio, and the input-output transfer function used to compress the dynamic range of the low-frequency component implements a second compression ratio, and
the first compression ratio is lower than the second compression ratio.

17. The method of claim 15, where:
the input-output transfer function used to compress the dynamic range of the mid-frequency component implements a first compression threshold, and the input-output transfer function used to compress the dynamic range of the low-frequency component implements a second compression threshold, and
the first compression threshold is greater than the second compression threshold.

18. A non-transitory computer-accessible storage medium storing program instructions that when executed on one or more processors cause the one or more processors to:
receive audio signals from an audio signal source;
filter the audio signals to produce a high-frequency component, a mid-frequency component, and a low-frequency component of the audio signals;
compress the dynamic range of the mid-frequency component based at least in part on a first input-output transfer function;
compress the dynamic range of the low-frequency component based at least in part on a second input-output transfer function;
combine the mid-frequency component and the low-frequency component to produce a combined component;
transmit the high-frequency component to an air-conduction transducer; and
transmit the combined component to a bone-conduction transducer.

19. The non-transitory computer-accessible storage medium of claim 18, wherein the program instructions when executed on the one or more processors cause the one or more processors to:
- compress the dynamic range of the mid-frequency component based at least in part on a first input-output transfer function using a first compression ratio; and
- compress the dynamic range of the low-frequency component based at least in part on a second input-output transfer function using a second compression ratio that is greater than the first compression ratio.

20. The method of claim 11, further comprising:
configuring, in response to input from user controls of the device, one or more compressors that perform said compressing.

* * * * *